United States Patent [19]

Mei et al.

[11] Patent Number: 5,366,926
[45] Date of Patent: Nov. 22, 1994

[54] LOW TEMPERATURE PROCESS FOR LASER DEHYDROGENATION AND CRYSTALLIZATION OF AMORPHOUS SILICON

[75] Inventors: Ping Mei, Palo Alto; James B. Boyce, Los Altos; Richard I. Johnson, Menlo Park; Michael G. Hack, Mountain View; Rene A. Lujan, Sunnyvale, all of Calif.

[73] Assignee: Xerox Corporation, Stamford, Conn.

[21] Appl. No.: 73,022

[22] Filed: Jun. 7, 1993

[51] Int. Cl.$^5$ .............................................. H01L 21/26
[52] U.S. Cl. ........................................ 437/173; 437/2; 437/4; 437/19; 437/907; 148/DIG. 90; 148/DIG. 93
[58] Field of Search ..................... 437/2, 4, 173, 174, 437/907, 908, 19, 173; 148/DIG. 90, DIG. 93, DIG. 94, DIG. 4, DIG. 91

[56] References Cited

U.S. PATENT DOCUMENTS

| | | | |
|---|---|---|---|
| 4,439,245 | 3/1984 | Wu | 437/19 |
| 5,145,808 | 9/1992 | Sameshima et al. | 437/173 |
| 5,162,239 | 11/1992 | Winer et al. | 437/4 |

OTHER PUBLICATIONS

Panvoke et al., "Laser Annealing of Hydrogenated Amorphous Silicon", Journal of Electronic Material, vol. 9, No. 5, 1980, pp. 905–912.

Sameshima, T.; Usui, S. Pulsed Laser–Induced Amorphization of Silicon Films. *Journal of Applied Physics*, vol. 70, No. 3, 1 Aug. 1991, 1281–1289.

Sera, K.; Okumura, F.; Uchida, H.; Itoh, S.; Kaneko, S.; Hotta, K. High–Performance TFT's Fabricated by XeCl Excimer Laser Annealing of Hydrogenated Amorphous–Silicon Film. *IEEE Transactions on Electron Devices*, vol. 36, No. 12, Dec. 1989, 2868–2872.

He, S. S.; Stephens, D. J.; Lucovsky, G. Improved Electrical Performance of a–Si:H Thin Film Transistors, TFTs With n+ $\mu$c–Si Contact, and Silicon Oxide and Nitride Dual–Layer Dielectrics, Not Yet Published.

Shimizu, K.; Sugiura, O.; Matsumura, M. High–Performance Bottom–Gate Poly-Si/SiN TFTs on Glass-Substrate. *Technical Digest of the International Electron Device Meeting*, 1992, 27.1.1–27.1.4.

Shimizu, K.; Sugiura, O.; Mastsumura, M. On–Chip Bottom–Gate Polysilicon and Amorphous Silicon Thin–Film Transistors Using Excimer Laser Annealing. *Japanese Journal of Applied Physics*. vol. 29, No. 10, Oct. 1990, L1775–L1777.

Primary Examiner—Tom Thomas
Assistant Examiner—Tuan Nguyen
Attorney, Agent, or Firm—John M. Kelly

[57] ABSTRACT

A low temperature process for dehydrogenating amorphous silicon using lasers. Dehydrogenation occurs by irradiating one or more areas of a hydrogenated amorphous silicon layer with laser beam pulses at a relatively low energy density. After the multiple laser pulse irradiation at a relatively low energy density, the laser energy density is increased and multiple irradiation at a higher energy density is performed. If after the multiple irradiation at the higher energy density the amorphous silicon hydrogen content is still too high, dehydrogenation proceeds by multiple irradiations at a yet higher energy density. The irradiation at the various energy densities can result in the formation of polysilicon due to melting of the amorphous silicon layer. As irradiation may be selectively applied to the amorphous silicon, an integral amorphous silicon-polysilicon structure may be formed.

9 Claims, 5 Drawing Sheets

LOW TEMPERATURE PROCESS FOR LASER DEHYDROGENATION AND CRYSTALLIZATION OF AMORPHOUS SILICON

BACKGROUND OF THE PRESENT INVENTION

Plasma enhanced chemical vapor deposition (PECVD) is a useful way of depositing high quality amorphous silicon thin films on various substrates. One reason for that quality is that the resulting amorphous silicon contains a significant amount of hydrogen (about 5–10 atomic %). While such a hydrogen content is generally beneficial when fabricating devices from amorphous silicon, the hydrogen complicates the formation of polysilicon devices from PECVD deposited amorphous silicon when using laser crystallization. This is so since laser crystallization of hydrogenated amorphous silicon tends to cause potentially explosive hydrogen ablation from the amorphous silicon.

One known method of dehydrogenizing amorphous silicon is to anneal the amorphous silicon/substrate structure at about 450° C. for several hours prior to laser crystallization. This method removes hydrogen from the amorphous silicon and thus enables the production of polysilicon using laser recrystallization without the problem of ablation. However, the characteristics of devices made from dehydrogenated amorphous silicon are not good for devices, whereas those of similar devices made from hydrogenated amorphous silicon are of device grade.

Thus in the prior art, the fabrication of hybrid amorphous silicon/polysilicon devices on the same substrate typically required a trade-off between the characteristics of the amorphous silicon devices and the polysilicon devices.

Thus, there exists a need for low substrate temperature methods of dehydrogenizing and crystallizing selected areas of an amorphous silicon layer. The usefulness of such methods would further increase if they enabled PECVD deposition, dehydrogenation, and crystallization in the same chamber.

SUMMARY OF THE INVENTION

The present invention provides a low substrate temperature process for selectively dehydrogenizing and crystallizing amorphous silicon using lasers. As the inventive process results in polycrystallized silicon, the inventive process produces polycrystalline silicon and amorphous silicon on the same substrate.

The dehydrogenation process involves irradiating with a short wavelength, pulsed laser one or more areas of a hydrogenated amorphous silicon layer with laser beam pulses at a relatively low energy density (say about 150 mJ/cm$^2$). After the multiple laser pulse irradiations at a relatively low energy density, the laser energy density is increased (say to about 300 mJ/cm$^2$) and the amorphous silicon layer is again irradiated with multiple laser pulses. If after the irradiations at the higher energy density the amorphous silicon hydrogen content is still too high, dehydrogenation then proceeds by irradiating the amorphous silicon layer multiple times at a yet higher energy density (say at about 374 mJ/cm$^2$). This also produces larger and better quality polysilicon grains.

The irradiations not only drive out the hydrogen, but produce polysilicon due to the melting and subsequent recrystallization of the amorphous silicon layer. As the irradiations may be selectively applied to the amorphous silicon, an integral amorphous silicon-polysilicon structure can be formed. The last laser scan can be used to improve the quality of the polysilicon grains.

DETAILED DESCRIPTION OF THE ILLUSTRATED EMBODIMENT

Figure 1:
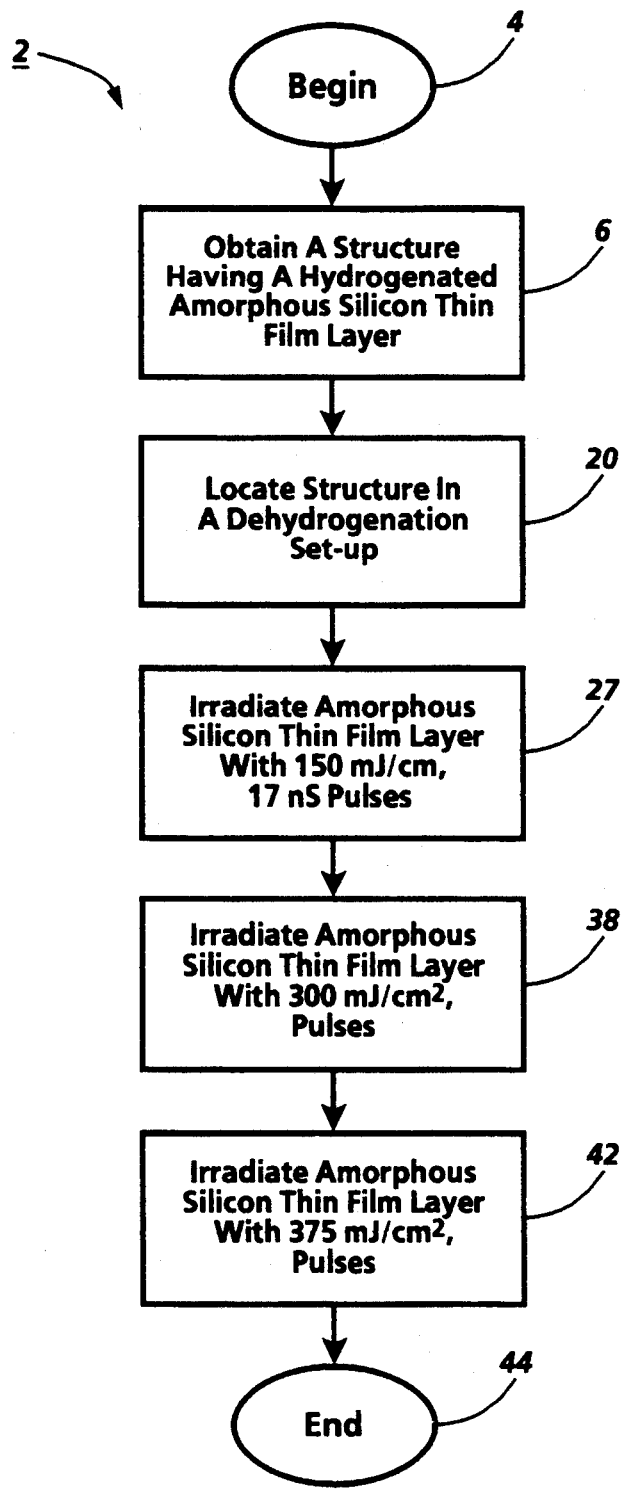
FIG. 1 is a flow chart of a dehydrogenation process according to the principles of the present invention.

FIG. 1 shows a flow chart 2 of an amorphous silicon dehydrogenation and crystallization process in accordance with the principles of the present invention. That flow chart, taken in conjunction with the following description and in conjunction with FIGS. 2 through 5, describes an illustrative embodiment of the inventive process. Many other embodiments, which are also in accord with the principles of the present invention, are also possible.

Figure 2:
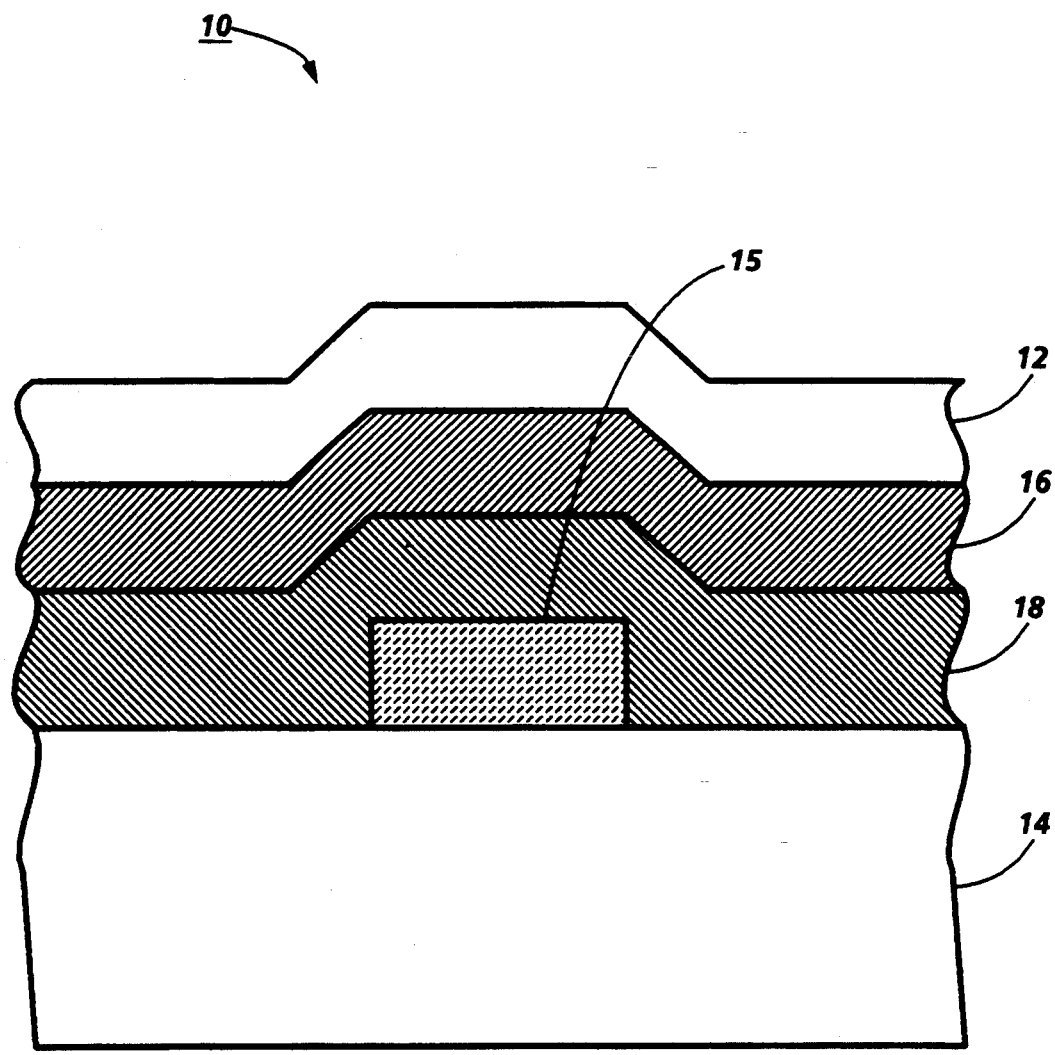
FIG. 2 shows a structure having a hydrogenated amorphous silicon thin film layer suitable for dehydrogenation according to the principles of the present invention.

The flow chart 2 begins, step 4, by obtaining a structure with a hydrogenated amorphous silicon thin film layer, step 6. Such a structure 10 is shown in FIG. 2. The structure 10 is comprised of an undoped, hydrogenated, amorphous silicon thin film layer 12 over a substrate 14 having an attached CrMo strip 15. Between the amorphous silicon thin film layer and the substrate and strip are insulating layers 16 and 18. The described process dehydrogenates and crystallizes some (possibly all) areas of the amorphous silicon thin film layer 12 into polysilicon, leaving an integral amorphous silicon-polysilicon structure. However, for simplicity the term "amorphous silicon thin film layer 12" will be used to identify the subject layer, whether that layer is hydrogenated, dehydrogenated, or crystallized.

As mentioned, the process 2 leaves an integral amorphous silicon-polysilicon structure. The polysilicon areas of such an structure have many uses, including the fabrication of TFT (thin film transistor) devices. For example, the CrMo strip 15 may eventually become a gate contact to a TFT formed from the polysilicon produced by the dehydrogenation process.

The structure 10 is produced by depositing a 40 nm thick CrMo strip 15 onto a Corning 7059 substrate 14. A 40 nm thick SiN insulating layer 18 is then grown over both the CrMo strip and the substrate. Next, a 50 nm thick SiO$_2$ insulating layer 16 is grown over the SiN insulating layer 18. Finally, a 70 nm thick layer of hydrogenated amorphous silicon is deposited by PECVD over the Oxide insulating layer 16. A typical PECVD deposition process uses a deposition temperature of about 250° C., deposits about 5–10 nm/min of amorphous silicon, and results in an amorphous silicon thin film layer having about 5–10 atomic % hydrogen.

It is to be understood that the inventive process may be used with many other structures than structure 10.

For example, the SiO$_2$ insulating layer 16 and the SiN insulating layer 18 may be replace with a single 200 nm thick SiO$_2$ buffer layer. However, the intermediate layer or layers between the amorphous silicon layer and the substrate do affect dehydrogenation and crystallization.

Figure 3:
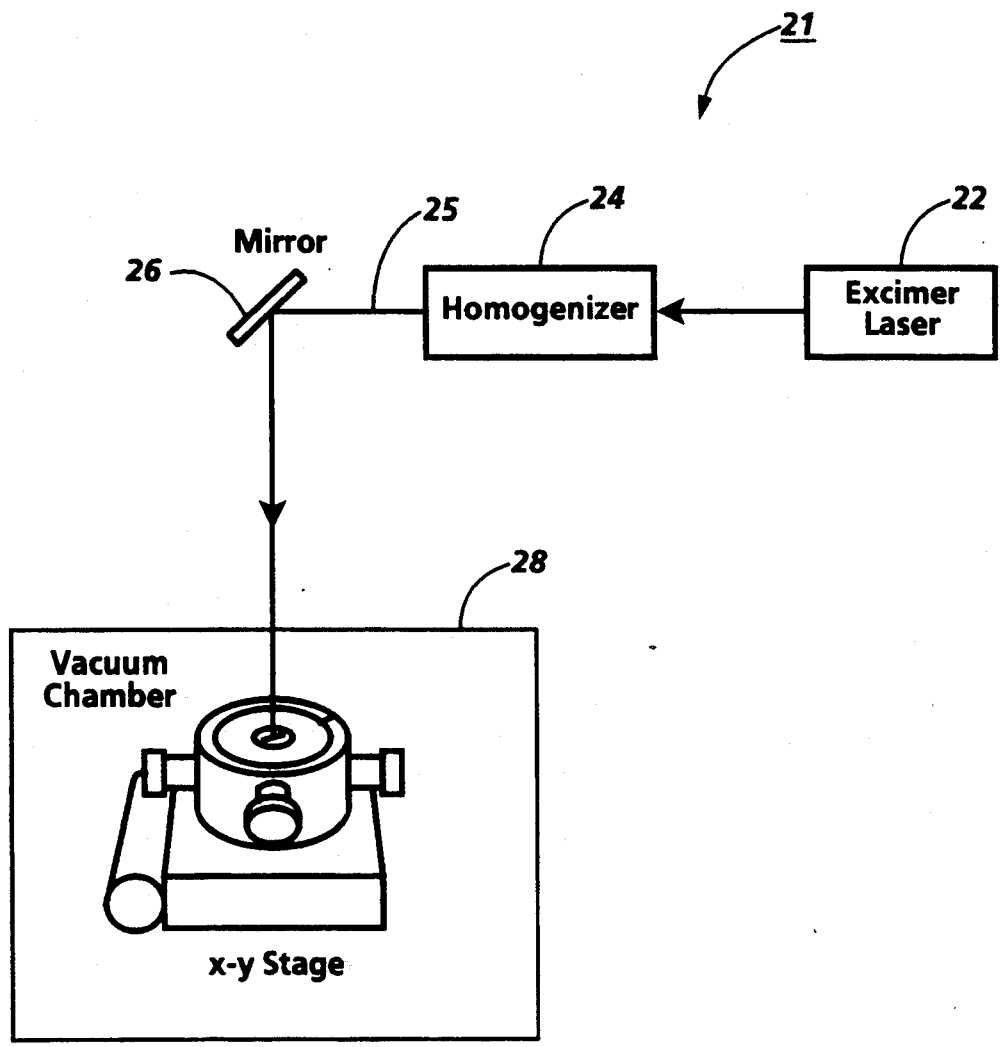
FIG. 3 illustrates the system layout of the equipment used to dehydrogenated the amorphous silicon thin film layer shown in FIG. 2.

Referring back to FIG. 1, after the structure 10 is obtained, it is located in a dehydrogenation setup, step 20. FIG. 3 shows a typical dehydrogenation setup 21 which includes a XeCl excimer laser 22. The excimer laser inputs a gaussian shaped, pulsed laser beam at a wavelength of 308 nm and a pulse width of 17 ns into a beam homogenizer 24. The output laser beam 25 from the homogenizer is reflected from a mirror 26 into a vacuum chamber 28. Within the vacuum chamber is an X-Y positioner 30 that holds the structure 10. Beneficially, the described process can be performed in the same chamber used for PECVD deposition.

The XeCl excimer laser 22 produces the laser energy that dehydrogenates the amorphous silicon thin film 12. The gaussian shaped laser beam from the excimer laser is converted to a substantially square profiled laser beam by the homogenizer 24. The laser beam 25 from the homogenizer is reflected into a vacuum chamber 26 such that it radiates perpendicularly onto the structure 10 (see FIG. 4). The vacuum stage 26 creates a vacuum of about 10$^{-7}$ torr, while the X-Y positioner moves the structure 10 in the X-Y plane (relative to the laser beam). Movement in the X-Y plane is needed since the laser beam 25 is fixed in position and as the resulting spot steps over the amorphous silicon thin film 12.

Dehydrogenizing the Amorphous Silicon Thin Film Layer

Figure 4:
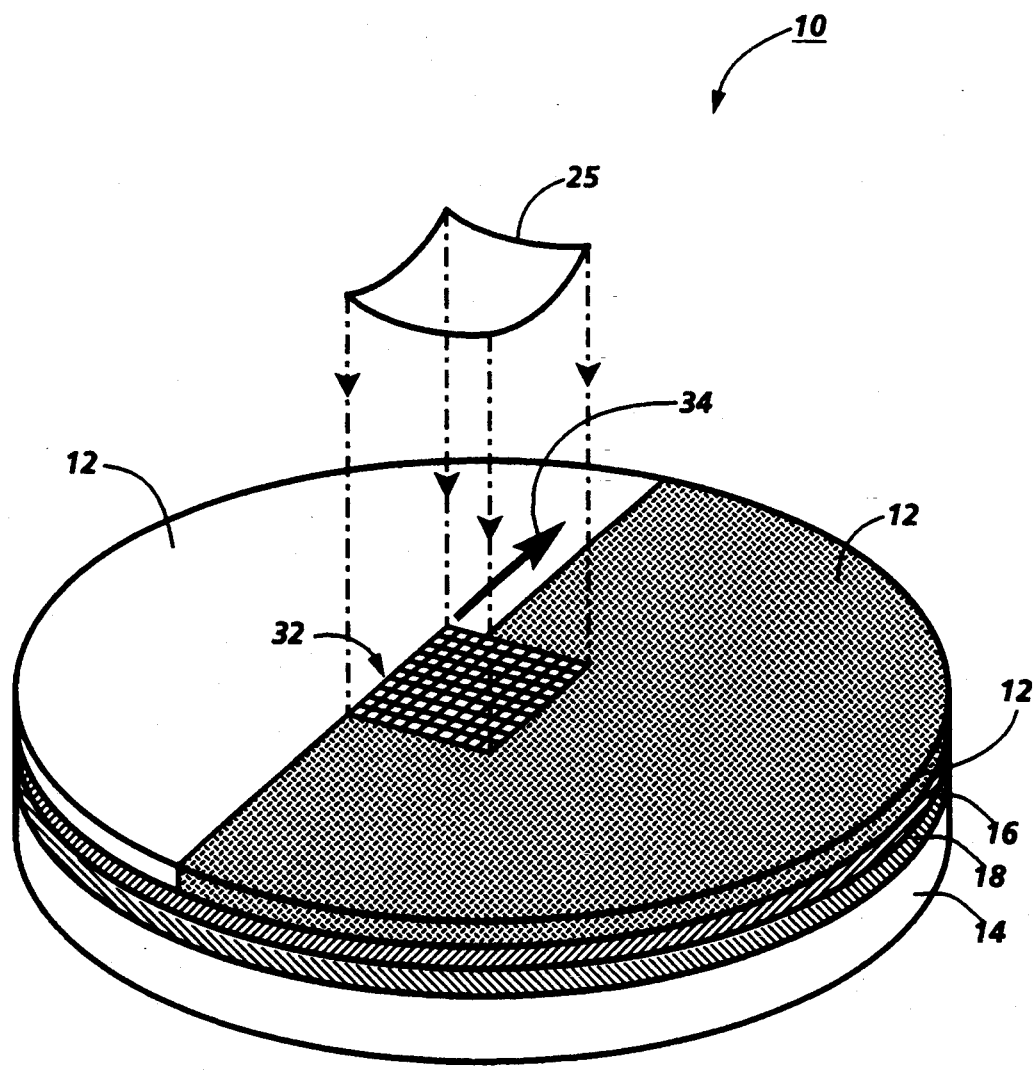
FIG. 4 shows a laser beam from the system shown in FIG. 3 irradiating the amorphous silicon thin film layer shown in FIG. 2.

Referring again to FIG. 1, with the structure 10 mounted in the dehydrogenation setup 21, laser irradiation begins, step 27. Referring now to FIG. 4, the laser beam 25 is pulsed and irradiated onto the amorphous silicon thin film layer 12, producing a substantially uniform 4×4 mm spot 32. The laser beam 25 has an energy of about 150 mJ/cm$^2$ (and a duration of about 17 ns). As indicated by the arrow 34 in FIG. 4, the X-Y positioner 30 then moves the structure 10 a small amount. Then another 150 mJ/cm$^2$, 17 ns laser pulse is applied to the amorphous silicon thin film layer. By small amount it is meant a distance such that the second pulse overlaps about 95% of the surface area irradiated by the first pulse. The X-Y positioner stepping and laser pulsing continue until the area or areas to be dehydrogenated are irradiated.

Figure 5:
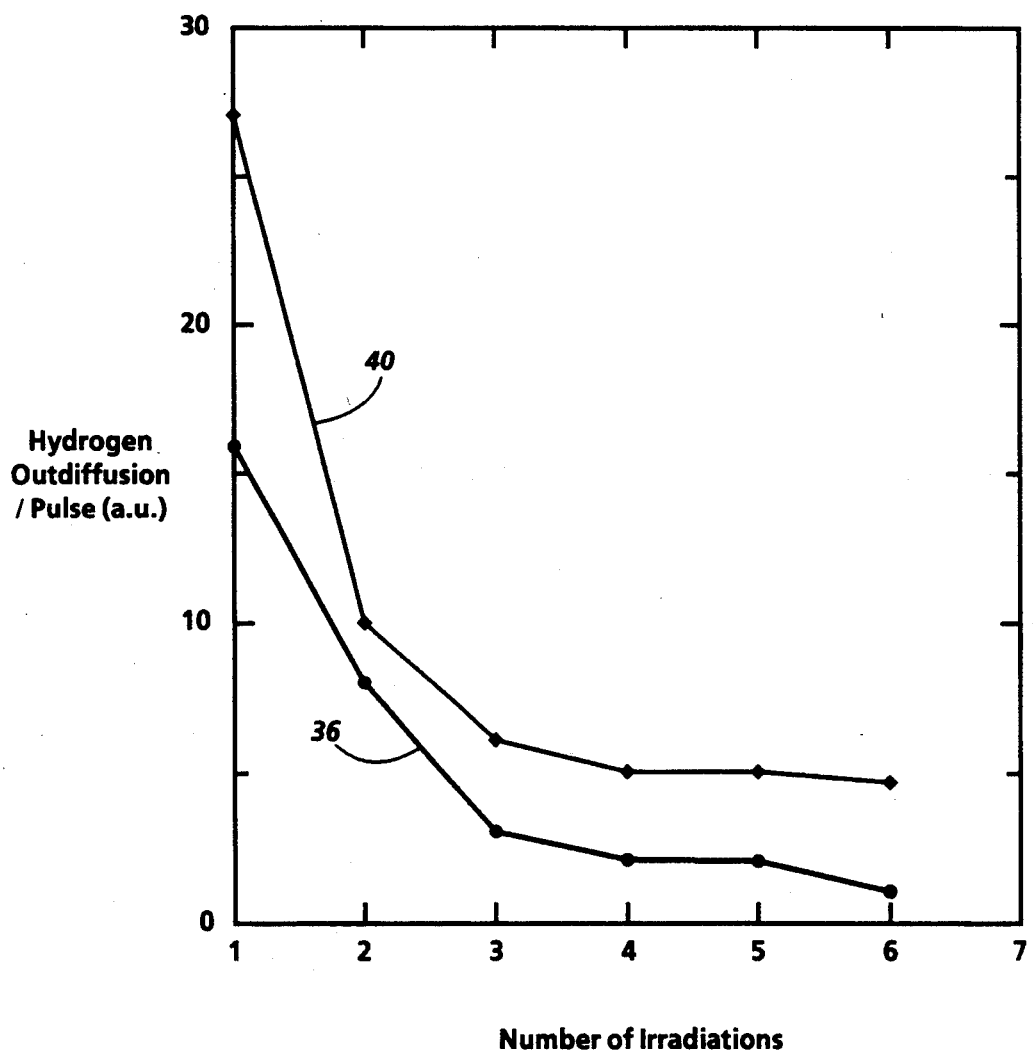
FIG. 5 is a plot of hydrogen loss from the amorphous silicon thin film layer verses the number of laser pulses.

Dehydrogenation of the amorphous silicon thin film layer 12 layer follows the plot 36 of FIG. 5, which shows typical hydrogen loss per laser pulse (the Y-axis being in an arbitrary unit scale). As shown, dehydrogenation is relatively high with the first pulse, and then decreases rapidly. After the first two pulses, the additional pulses result in relatively small amounts of dehydrogenation. However, the additional laser pulses significantly improve the interface between layers 12 and 16 for further dehydrogenation. On an absolute basis, a PECVD deposited amorphous silicon thin film layer typically has about 7 atomic % Hydrogen. After fully irradiating with the 150 mJ/cm$^2$, 17 ns laser pulses the amorphous silicon thin film layer 12 has about 4 atomic % Hydrogen. Dehydrogenation from PECVD deposited amorphous silicon thin films is believed to be substantially linear with laser energy densities between 100 to 250 mJ/cm$^2$. However, voids (probably from the hydrogen out-diffusion from localized areas of the amorphous silicon thin film) form in the amorphous silicon thin film layer 12 at energy densities above 150 mJ/cm$^2$ (when using the dehydrogenation set up 21). Furthermore, at laser energy densities above 250 mJ/cm$^2$, the amorphous silicon thin film layer starts to ablate.

Referring once again to FIG. 1, after irradiation by the 150 mJ/cm$^2$ pulses, dehydrogenation proceeds by irradiating once again in the manner just described, but at a laser energy density of 300 mJ/cm$^2$, step 38. Dehydrogenation by the first laser pulse at 300 mJ/cm$^2$ is over 20 times that from the last laser pulse at 150 mJ/cm$^2$. Furthermore, as shown by plot 40 in FIG. 5, dehydrogenation by the first laser pulse at 300 mJ/cm$^2$ is much higher than the dehydrogenation caused by the first irradiation at 150 mJ/cm$^2$. Also as shown by plot 40, dehydrogenation verses number of pulses decreases rapidly. After irradiating with the 300 mJ/cm$^2$ pulses, the amorphous silicon thin film layer 12 has about 1 atomic % Hydrogen.

Referring once again to FIG. 1, after irradiation by the 300 mJ/cm$^2$ pulses, dehydrogenation then proceeds by irradiating again, but at a laser energy density of 374 mJ/cm$^2$, step 42. This irradiation causes the amorphous silicon layer 12 to melt and recrystallize with larger grains than the irradiations by the 300 mJ/cm$^2$. After irradiating the amorphous silicon thin film layer with the 374 mJ/cm$^2$ pulses, the dehydrogenation process ends, step 44. The amorphous silicon thin film layer 12 has about 0.5 atomic % Hydrogen. From the above, an effective dehydrogenation process is to irradiate the target amorphous silicon with multiple laser pulses at one energy density, and then to irradiate multiple times again with an increased laser energy density. The process may continue with additional multiple irradiation cycles to further reduce the hydrogen content.

Crystallization of the Amorphous Silicon Thin Film

The irradiation of the amorphous silicon thin film layer 12 as described above results in significant compositional changes to that layer. Not only is hydrogen out-diffused, but the irradiation results in melting. As the melt cools, silicon grains form. It is believed that the varying rates of dehydrogenation shown in FIG. 5 are a result of the dependency of dehydrogenation on crystallinity, which in turn depends upon melt duration, melt depth, and the hydrogen bonding states.

The illustrative embodiment uses an first irradiation energy of 150 mJ/cm$^2$. At a 308 nm wavelength, this energy is above the surface melt threshold.

Irradiation at 150 mJ/cm$^2$ (as described above) result in a melt duration of about 14 ns. The melt is partially, but not completely, through the amorphous silicon thin film layer 12. The resulting grain sizes average about 20 nm. The irradiations at 300 mJ/cm$^2$ result in a melt duration of about 21 ns, which corresponds to a complete melt through of the amorphous silicon thin film layer 12. The resulting grain sizes again average about 20 nm. However, the irradiations at 374 mJ/cm$^2$, which also correspond to a complete melt through the film, shows improved crystallinity. The average grain size being approximately 1500 nm in the lateral direction.

Process Parameters

The illustrative embodiment uses a first irradiation energy density of 150 mJ/cm$^2$. With a 308 nm wavelength, 17 ns pulse, this energy density is above the surface melt threshold (the minimum energy required to cause the surface to begin melting), but below the melt through threshold (the minimum energy required to cause the amorphous silicon layer to begin melting throughout its thickness) and the ablation threshold (the minimum energy required to cause the amorphous silicon layer to ablate). The illustrative embodiment also uses a third irradiation energy density of 374 mJ/cm$^2$, which is above the melt through threshold.

The surface melt, melt through, and ablation thresholds are useful parameters for selecting the energy densities used in the inventive process. The first irradiation energy density should be above the surface melt threshold, but below the melt through and ablation thresholds. The final irradiation threshold density should be above the melt through thresholds and below the ablation threshold. The intermediate energy density, if any, should be between the first and last energy densities.

The illustrative embodiment uses 308 nm wavelength, 17 ns laser pulses. In general, the longer the wavelength the longer the pulse duration required for a given amount of melt/dehydrogenation. However, the laser wavelength used must be absorbed by the amorphous silicon. It is desired that a wavelength should be used such that 90% of the irradiating light is absorbed within the first half of the amorphous silicon layer.

From the foregoing, numerous modifications and variations of the principles of the present invention will be obvious to those skilled in its art. Therefore the scope of the present invention is to be defined by the appended claims.

What is claimed:

1. A method of removing hydrogen from a hydrogenated amorphous silicon structure having a surface melt threshold and a melt through threshold, said method comprising the steps, in the sequence set forth, of:
   irradiating an area of the hydrogenated amorphous silicon structure with a plurality of laser beam pulses at a first energy density; and
   irradiating said area with a plurality of laser beam pulses at a second energy density, said second energy density being greater than said first energy density.

2. The method according to claim 1, further including the step of irradiating said area with a plurality of laser beam pulses at a third energy density after irradiation at said second energy density, said third energy density being greater than said second energy density.

3. The method according to claim 2, wherein said first energy density is above the surface melt threshold and below the melt through threshold.

4. The method according to claim 3, wherein said third energy density is above the melt through threshold.

5. The method according to claim 1, wherein said first energy density is above the surface melt threshold and below the melt through threshold.

6. The method according to claim 5, wherein said second energy density is above the melt through threshold.

7. A method of producing polycrystallized silicon from hydrogenated amorphous silicon having a surface melt threshold and a melt through threshold, said method comprising the steps, in the sequence set forth, of:
   irradiating an area of the hydrogenated amorphous silicon structure with a plurality of laser beam pulses at a first energy density;
   irradiating said area with a plurality of laser beam pulses at a second energy density, said second energy density being greater than said first energy density; and
   irradiating said area with laser beam pulses at a third energy density, said third energy density being greater than said second energy density.

8. The method according to claim 7, wherein said first energy density is above the surface melt threshold and below the melt through threshold.

9. The method according to claim 8, wherein said third energy density is above the melt through threshold.

* * * * *